US009831107B2

(12) United States Patent
Siefering et al.

(10) Patent No.: US 9,831,107 B2
(45) Date of Patent: Nov. 28, 2017

(54) PROCESSING SYSTEM AND METHOD FOR PROVIDING A HEATED ETCHING SOLUTION

(71) Applicant: TEL FSI, Inc., Chaska, MN (US)

(72) Inventors: Kevin L Siefering, Excelsior, MN (US); William P Inhofer, Plymouth, MN (US); David DeKraker, Burnsville, MN (US)

(73) Assignee: TEL FSI, INC., Chaska, MN (US)

( * ) Notice: Subject to any disclaimer, the term of this patent is extended or adjusted under 35 U.S.C. 154(b) by 559 days.

(21) Appl. No.: 14/209,966

(22) Filed: Mar. 13, 2014

(65) Prior Publication Data

US 2014/0277682 A1    Sep. 18, 2014

Related U.S. Application Data

(60) Provisional application No. 61/801,072, filed on Mar. 15, 2013, provisional application No. 61/924,838, (Continued)

(51) Int. Cl.
*H01L 21/67* (2006.01)
*G05B 19/41* (2006.01)
(Continued)

(52) U.S. Cl.
CPC ...... *H01L 21/67075* (2013.01); *G05B 19/418* (2013.01); *H01L 21/31111* (2013.01); *H01L 21/6708* (2013.01); *H01L 21/67017* (2013.01)

(58) Field of Classification Search
USPC .......................................... 700/121; 216/93
See application file for complete search history.

(56) References Cited

U.S. PATENT DOCUMENTS 5,158,100 A * 10/1992 Tanaka .................. B08B 7/0092
134/105
5,470,421 A 11/1995 Nakada et al.
(Continued)

FOREIGN PATENT DOCUMENTS

CN    101215100 A    7/2008
CN    101234853 A    8/2008
(Continued)

OTHER PUBLICATIONS

United States Patent and Trademark Office, International Search Report and Written Opinion for corresponding International Application No. PCT/US14/26432, mailed Jul. 18, 2014, 16 pages.
(Continued)

*Primary Examiner* — Jason Lin
(74) *Attorney, Agent, or Firm* — Kagan Binder, PLLC

(57) ABSTRACT

A method and processing system are provided for independent temperature and hydration control for an etching solution used for treating a wafer in process chamber. The method includes circulating the etching solution in a circulation loop, maintaining the etching solution at a hydration setpoint by adding or removing water from the etching solution, maintaining the etching solution at a temperature setpoint that is below the boiling point of the etching solution in the circulation loop, and dispensing the etching solution into the process chamber for treating the wafer. In one embodiment, the dispensing includes dispensing the etching solution into a processing region proximate the wafer in the process chamber, introducing steam into an exterior region that is removed from the wafer in the process chamber, and treating the wafer with the etching solution and the steam.

13 Claims, 5 Drawing Sheets

Related U.S. Application Data filed on Jan. 8, 2014, provisional application No. 61/924,847, filed on Jan. 8, 2014, provisional application No. 61/928,894, filed on Jan. 17, 2014.

(51) Int. Cl.
*G05B 19/418* (2006.01)
*H01L 21/311* (2006.01)

(56) References Cited

U.S. PATENT DOCUMENTS

| | | | |
|---|---|---|---|
| 6,001,215 A | 12/1999 | Ban | |
| 2002/0007803 A1* | 1/2002 | Chiu | B01D 1/0052 122/13.01 |
| 2002/0019128 A1 | 2/2002 | Lee et al. | |
| 2002/0072235 A1 | 6/2002 | Haga et al. | |
| 2002/0102851 A1 | 8/2002 | Yokomizo et al. | |
| 2003/0056577 A1* | 3/2003 | Ottow | G01N 25/08 73/61.46 |
| 2003/0181040 A1* | 9/2003 | Ivanov | C23C 18/1628 438/687 |
| 2004/0004004 A1* | 1/2004 | Chueh | C25D 5/48 205/220 |
| 2004/0157452 A1* | 8/2004 | Ogawa | H01L 21/31111 438/691 |
| 2004/0200806 A1* | 10/2004 | Izuta | C23F 1/46 216/99 |
| 2005/0230045 A1* | 10/2005 | Okuchi | H01L 21/31111 156/345.18 |
| 2006/0151112 A1* | 7/2006 | Yoshida | B08B 3/00 156/345.15 |
| 2008/0087645 A1* | 4/2008 | Izuta | C09K 13/04 216/93 |
| 2009/0236316 A1* | 9/2009 | Itou | H01L 21/67086 216/93 |
| 2010/0210110 A1 | 8/2010 | Okuchi et al. | |
| 2011/0056913 A1* | 3/2011 | Mayer | C23F 1/08 216/84 |
| 2012/0006790 A1 | 1/2012 | Komori et al. | |
| 2012/0067847 A1* | 3/2012 | Sakurai | H01L 21/31111 216/83 |
| 2012/0247505 A1* | 10/2012 | Brown | H01L 21/30612 134/3 |
| 2014/0264153 A1 | 9/2014 | Siefering et al. | |

FOREIGN PATENT DOCUMENTS

| | | |
|---|---|---|
| JP | 07-230981 A | 8/1995 |
| JP | 1233157 B | 5/2005 |
| TW | 511180 B | 11/2002 |
| TW | 201102352 A | 1/2011 |

OTHER PUBLICATIONS

United States Patent and Trademark Office, International Search Report and Written Opinion for corresponding International Application No. PCT/US14/26581, mailed Jul. 14, 2014, 12 pages.
Notification of Examination Opinions and translation of Notification of Examination Opinions, TW Patent Application No. 103109718, dated Oct. 16, 2015, pp. 1-19.
Notification of Examination Opinions and translation of Notification of Examination Opinions, TW Patent Application No. 103109721, dated Oct. 6, 2015, pp. 1-13.
Second Notification of Examination Opinions and translation of Notification of Examination Opinions, TW Patent Application No. 103109718, dated Aug. 22, 2016, pp. 1-4.
First Office Action issued by SIPO, CN Application No. 2014[7]80015977.9, dated Mar. 2, 2017, pp. 1-13.

* cited by examiner

PROCESSING SYSTEM AND METHOD FOR PROVIDING A HEATED ETCHING SOLUTION

CROSS-REFERENCE TO RELATED APPLICATIONS

Pursuant to 37 C.F.R. §1.78(a)(4), this application claims the benefit of and priority to prior filed Provisional Application Ser. No. 61/801,072, filed Mar. 15, 2013; Provisional Application Ser. No. 61/924,838, filed Jan. 8, 2014; Provisional Application Ser. No. 61/924,847, filed Jan. 8, 2014; and Provisional Application Ser. No. 61/928,894, filed Jan. 17, 2014. The entire contents of these applications are expressly incorporated herein by reference.

FIELD OF INVENTION

The present invention relates to the field of providing a heated etching solution to a process chamber where it is used to treat a wafer, and more particularly to a processing system and method for improving temperature and water content (hydration level) control of the heated etching solution.

BACKGROUND OF THE INVENTION

In the manufacture of semiconductor devices, acidic etching solutions are used for treating and etching wafers. Phosphoric acid ($H_3PO_4$) has been used for decades in immersion wet benches as an etching solution to etch silicon nitride films and other films. In a typical application, the phosphoric acid bath is maintained at a desired boiling condition by adding heat to the bath using in-line and/or tank wall heaters and balancing the water that is lost to boiling by adding liquid water back to the bath.

The phosphoric acid is typically delivered to the bath as a mixture with water, for example as an 85% phosphoric acid-15% water mixture (percentage by weight), which boils at a temperature of about 158° C. at atmospheric pressure. This is primarily done to reduce the viscosity of the phosphoric acid to a level that facilitates delivery of the etching solution in a manufacturing facility using conventional liquid chemical distribution systems. Heaters are used to bring this solution up to its boiling point. As the mixture boils, the hydration level falls as water vapor is driven off and the temperature (boiling point) rises until the desired processing temperature (typically a boiling point of 160° C. or 165° C.) is reached. Once at this boiling temperature, the heaters are typically driven at a constant power level to continue adding heat to the system and the temperature is controlled at the desired setpoint by regulating the addition of water. The wet bench processing tank in which wafers are immersed is open to the atmosphere, so this boiling of the solution occurs at atmospheric pressure. Because the pressure is fairly constant, by maintaining a constant temperature and boiling condition, the hydration level is maintained at a constant level as well.

When the above boiling point control is applied to a single wafer spin cleaning tool, a new set of challenges arises. In a single wafer tool, the heated etching solution is typically circulated in a circulation loop with a supply tank, a pump, a heater and a filter, and the heated etching solution that is pressurized by the pump is drawn from the circulation loop and a controlled flow of the heated etching solution is directed through a nozzle or spray bar and dispensed onto a surface of a spinning wafer. When the boiling point control described above for immersion wet benches is used in such a single wafer tool, the actual physical boiling of the heated etching solution does not occur in the heater in the circulation loop, since the pressure generated by the pump suppresses the boiling there. Instead, the boiling can occur in other places of the circulation loop where the pressure is reduced. When relatively small changes occur in either the temperature or the hydration level of the phosphoric acid in the circulation loop, the position or region where this boiling occurs can shift within the tool with detrimental effects when processing a wafer with the heated etching solution. Further, inadequate control of the temperature and hydration level of the heated etching solution can result in poor stability of the etching process, in addition to inadequate etch uniformity across large wafers.

SUMMARY OF THE INVENTION

According to one embodiment, a method is provided for independent temperature and hydration control for an etching solution used for treating a wafer in process chamber. The method includes circulating the etching solution in a circulation loop, maintaining the etching solution at a hydration setpoint by adding or removing water from the etching solution, maintaining the etching solution at a temperature setpoint that is below the boiling point of the etching solution in the circulation loop, and dispensing the etching solution into the process chamber for treating the wafer. In one embodiment, the dispensing includes dispensing the etching solution into a processing region proximate the wafer in the process chamber, introducing steam into an exterior region that is removed from the wafer in the process chamber, and treating the wafer with the etching solution and the steam.

According to another embodiment, the method includes circulating the etching solution in a circulation loop, selecting a first hydration setpoint for the etching solution, measuring a hydration level of the etching solution, maintaining the etching solution at the hydration setpoint by adding or removing water from the etching solution, selecting a temperature setpoint for the etching solution, where the temperature setpoint is below the boiling point of the etching solution in the circulation loop, measuring a temperature of the etching solution, maintaining the etching solution at the temperature setpoint by applying heat to the etching solution, and dispensing the etching solution from the circulation loop into the process chamber for treating the wafer.

According to one embodiment, a processing system is provided. The processing system includes a process chamber for treating a wafer with a heated etching solution, and a first circulation loop for providing an etching solution, wherein the first circulation loop includes a heater, a pump for pressurizing and circulating the etching solution, a temperature probe for monitoring the temperature of the etching solution, a hydration sensor for monitoring the water content of the heated etching solution, and a water supply for adding water to the etching solution.

DETAILED DESCRIPTION OF THE DRAWINGS

A more complete appreciation of the invention and many of attendant advantages thereof will be readily obtained as the same becomes better understood by reference to the following detailed description when considered in connection with the accompanying drawings, wherein:

FIG. 1 schematically shows a processing system for treating wafers with a heated etching solution according to an embodiment of the invention;

FIG. 2 schematically shows a process chamber for treating wafers with a heated etching solution according to an embodiment of the invention;

FIG. 3 schematically shows a process chamber for treating wafers with a heated etching solution according to an embodiment of the invention;

DETAILED DESCRIPTION OF SEVERAL EMBODIMENTS

Figure 1:
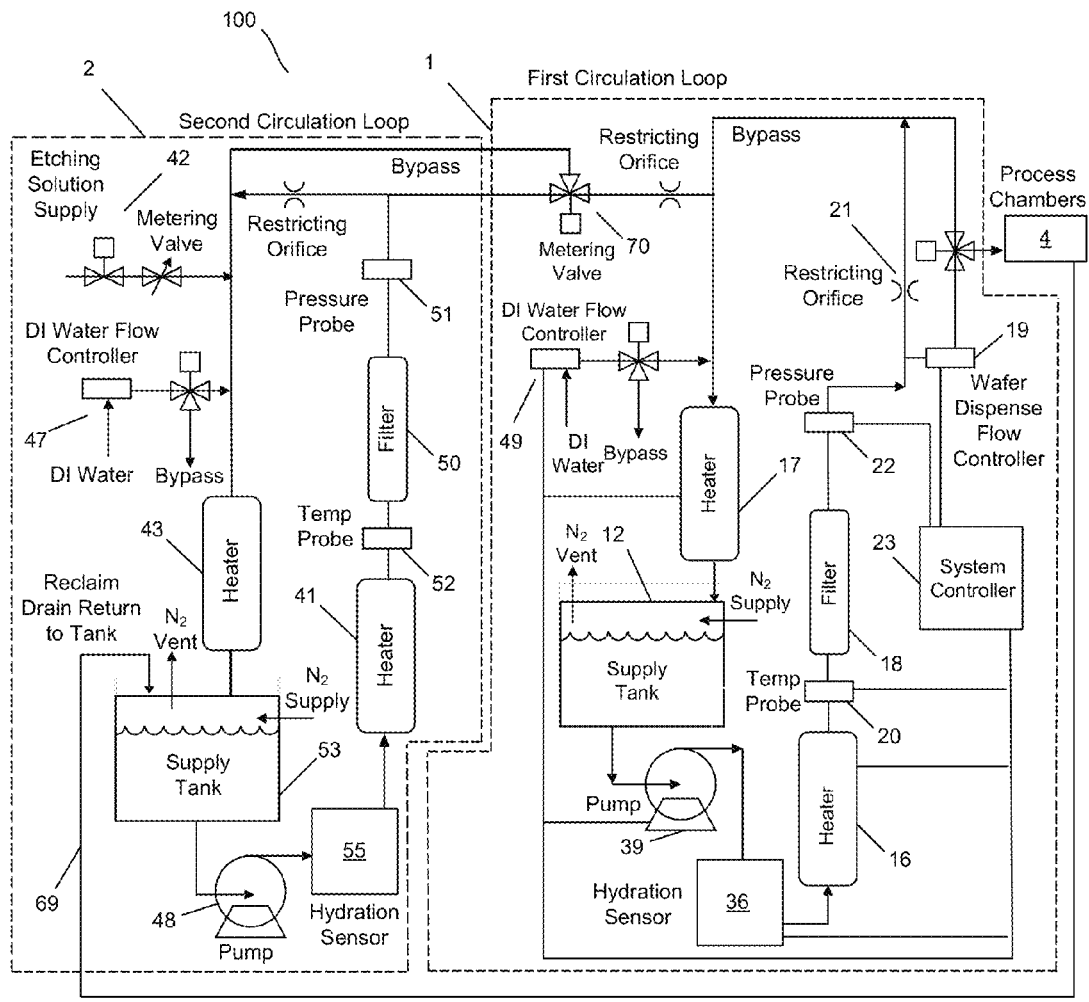

Embodiments of the invention relate to a processing system and a method for improving temperature and hydration level control of a heated etching solution. According to one embodiment, the etching solution can contain phosphoric acid, but embodiments of the invention may be applied to other etching solutions and mixtures.

In one non-limiting example, a method is described for improving temperature and hydration level control of a hot phosphoric acid etching solution. As described in the Background section, in a single wafer spin cleaning tool, boiling of the heated etching solution can occur in various positions or regions of the circulation loop, including downstream of the heater, where the pressure in the circulation loop is reduced. Boiling can occur on the downstream side of a wafer dispense flow controller for dispensing the heated etching solution from the circulation loop to the process chamber, or inside a nozzle or spray bar that delivers the heated etching solution to the wafer surface in the process chamber. Boiling can also occur in the circulation loop plumbing when the flow goes through a needle valve or orifice that controls the flow of the circulating etching solution back into a supply tank. When relatively small changes occur in either the temperature or the hydration level of the etching solution, the position or region where this boiling occurs can shift and the amount of boiling (amount of steam generated) within the system can vary dramatically.

In addition to variations in the boiling point, changes in phosphoric acid temperature or hydration level can cause changes in the etch rate of a wafer, for example the etch rate of a silicon nitride film that is treated with hot phosphoric acid. These changes can also cause other physical effects that can lead to variable etch rate and etch non-uniformity across the wafer. In a ORION™ tool (available from TEL FSI, Chaska, Minn.), the variable gas (steam) content of the phosphoric acid etching solution going into a linear spray bar above the wafer can cause strong variation in the liquid flow rate through the orifices down the length of the spray bar as liquid flow is occluded by the escaping gas flow. Since the steam is compressible, it expands rapidly as it leaves the spray bar above the wafer. This causes variation in the effective velocity down the length of the spray bar. The expanding gas can also accelerate liquid droplets and in some cases cause damage to sensitive structures on the wafer. Boiling also cools the fluid, and since the boiling does not occur uniformly in the spray bar or on the surface of the wafer, this boiling can drive radial temperature nonuniformity on the wafer. The variable amount of steam can also cause problems with the flow control of the dispensed chemical, as the expanding steam effectively causes more backpressure from the spray bar, increasing the back pressure on the flow controller, and actually reducing the maximum flow that can be achieved. All of these factors combine to result in nonuniformity of etching across the surface of an individual wafer as well as nonuniformity of etching from wafer to wafer as different wafers see different sets of conditions that result from the variable boiling effects.

The inventors have realized that a solution to the above-described problems is to eliminate boiling of the etching solution within the dispense plumbing (circulation loop) and in the nozzle or spray bar, as well as on the surface of the wafer. The etching solution can be operated at the same high temperature to achieve the desired etch rate of the wafer, but embodiments of the invention contemplate a lower hydration level than is commonly used so that a separation between the circulation loop etching solution temperature and the boiling point of the etching solution is possible. This allows for providing independent control of both the etching solution temperature and the hydration level of the etching solution. This independent control is different from the way immersion wet benches and single wafer tools have been operated, since in those systems, control of the etching solution temperature and the hydration level has been locked together by operating at a boiling condition for the etching solution. The inventors have further realized that a stability of an etch process can be significantly improved when both the etching solution temperature and the hydration level are independently known and controlled. Embodiments of the invention further enable higher etch rates and improved etch uniformity across large wafers.

In order to control the hydration level of the etching solution, a hydration sensor is needed that provides a signal that is indicative of the hydration level. This can, for example, include a refractometer that measures the refractive index of the etching solution, a near-infrared spectrometer, an auto titrator, a conductivity analyzer, or any of a number of similar instruments that are used for chemical concentration monitoring. The output from this sensor can be used by a controller to control the addition of water to the circulation loop and maintain the desired hydration setpoint of the etching solution. This can either be done in an on/off fashion by turning the addition of water on when the hydration level is below the target level and turn the addition of water off when the hydration level is above the target level, or preferably in a more continuous fashion using a proportional-integral-derivative (PID) loop to increase and decrease the flow of water into the circulation loop in response to the changing hydration level. Thus, the water addition is not based on the temperature of the etching solution but instead based on the hydration analysis and the desired hydration setpoint. Once the hydration level is controlled, the temperature of the etching solution may be controlled in a manner that is traditional to chemicals other than phosphoric acid (e.g., sulfuric acid), by regulating the power output of the heater based on temperature. Again, this can be done in an on/off fashion or preferably with a continuous PID type algorithm.

Once two separate control loops are set up that control the hydration level independently from the temperature using a system controller, the temperature of the etching solution can be controlled and maintained at a desired set-point (e.g., 180° C.) and the hydration level (e.g., about 10% $H_2O$) can be controlled and maintained so that the boiling point of the etching solution in the circulation loop under the circulation pressure (e.g., 190° C. at 20 psig) is higher than the boiling point under atmospheric pressure, and when the pressure drops to atmospheric pressure or near atmospheric pressure as the etching solution fluid exits the nozzle or spray bar above the wafer, the boiling point drops with the decreasing pressure, but the boiling point still remains above the local temperature of the etching solution. In this way, boiling of the etching solution in the circulation loop, the nozzle or the spray bar, and on the wafer, can be eliminated.

Some of the advantages of independently controlling the temperature and the hydration level of the etching solution include a) improved radial etch uniformity across the wafer, b) improved wafer-to-wafer etch uniformity, c) reduced damage of sensitive structures on the wafer, d) other potential advantages in process performance that may be realized by opening up hydration level as a new effective variable that can be used for process optimization (e.g., ability of an etching solution with a low hydration level to adsorb steam in process chamber to boost the temperature of the etching solution and achieve a higher etch rate), e) improved temperature control of the etching solution in the circulation loop (+\−tolerances), f) improved overall hydration level control of the etching solution in the circulation loop, g) improved flow control for dispensing the etching solution onto the wafer, and h) increased maximum dispense flow that can result in higher etch rate.

FIG. 1 schematically shows a processing system 100 for treating wafers with a heated etching solution according to an embodiment of the invention. The wafers may be 200 mm, 300 mm, 450 mm, or even larger Si wafers using in semiconductor manufacturing. However, embodiments of the invention may readily be applied to other types of wafers and substrates. The processing system 100 includes a first circulation loop 1, a second circulation loop 2, and one or more process chambers 4. In one example, the one or more process chambers 4 can include one or more single wafer process chambers that are each configured for processing one wafer at a time. In one example, the processing system 100 can include up to 8 process chambers. The first circulation loop 1 contains a supply tank 12 with a heated etching solution, means for flowing $N_2$ gas into the supply tank 12 and means for venting $N_2$ gas (and water vapor) from the supply tank 12, a pump 39 to pressurize the etching solution, a DI water supply system 49 that includes a DI water flow controller for controlling the flow of DI water into the first circulation loop 1. The first circulation loop 1 further includes a hydration sensor 36, a filter 18 is provided for filtering impurities and particles from the etching solution, and inline heaters 16 and 17 are provided for heating the etching solution. The pressure of the etching solution in the first circulation loop 1 can be regulated using the pump 39 and the pressure probe 22. A temperature probe 20 is provided for monitoring the temperature of the etching solution. A wafer dispense flow controllers 19 controls flow of the etching solution to each of the process chambers 4, and a loop bypass is configured for returning the circulating etching solution to the supply tank 12. The first circulation loop 1 provides the hot etching solution to the one or more process chambers 4, and reclaim drain 69 returns the etching solution to the second circulation loop 2.

The second circulation loop 2 can contain similar components as the first circulation loop 1. It provides additional heated etching solution to the first circulation loop 1 where the temperature and the hydration level of the additional heated etching solution may be selected to closely match the heated etching solution in the first circulation loop 1, thereby minimizing the disturbance of the hydration level and the temperature of the heated etching solution in the first circulation loop 1 when additional heated etching solution is provided to the first circulation loop 1. The second circulation loop 2 may be operated in a similar way as the first circulation loop with independent control over both the temperature and hydration level of the additional heated etching solution. Alternatively, the second circulation loop 2 may be operated in "boiling point" mode where control of the additional heated etching solution temperature and the hydration level are locked together by operating at a boiling condition for the additional heated etching solution.

The second circulation loop 2 contains a supply tank 53 with an additional heated etching solution, means for flowing $N_2$ gas into the supply tank 53 and means for venting $N_2$ gas (and water vapor) from the supply tank 53, a pump 48 to pressurize the etching solution, a DI water supply system 47 containing a DI water addition flow controller for controlling the flow of DI water into the second circulation loop 2. The second circulation loop 2 further includes a hydration sensor 55, a filter 50 is provided for filtering impurities and particles from the etching solution, and inline heaters 41 and 43 are provided for heating the etching solution. The pressure of the etching solution in the second circulation loop can be regulated using the pump 48 and the pressure probe 51. A temperature probe 52 is provided for monitoring the temperature of the etching solution. The second circulation loop 2 contains a fresh etching solution supply 42, a DI water supply system 47 that includes a DI water flow controller for controlling the flow of DI water into the second circulation loop 2. A temperature probe (sensor) 52 is provided for monitoring the temperature of the additional heated etching solution. A loop bypass line is configured for returning the additional heated etching solution to the supply tank 53. A metering valve 70 configured for introducing additional heated etching solution from the second circulation loop 2 to the first circulation loop 1.

According to one embodiment, the second circulation loop 2 heats up additional etching solution (e.g., phosphoric acid/water mixture) from room temperature to boiling and boils off water until the boiling point reaches the desired control temperature for the first circulation loop 1. The additional heated etching solution may be continuously recirculated within the second circulation loop 2. An additional heated etching solution at the correct boiling point and hydration level is then withdrawn from the second circulation loop 2 in order to refill the first circulation loop 1, where further heating and hydration level control can take place.

In one example, the additional heated etching solution in the second circulation loop 2 may be maintained at a higher temperature and/or lower hydration level than the heated etching solution in the first circulation loop 1.

The processing system 100 allows for tight temperature control in the first circulation loop 1 and continuous availability of additional heated etching solution during and following a refill of the first circulation loop 1 with heated additional etching solution from the second circulation loop 2. Although a heated etching solution containing a phosphoric acid-water mixture is described herein, those skilled in the art will readily realize that embodiments of the invention can easily be applied to other etching solutions and acids.

In order to reduce the cost of chemical for some etching applications, it may be advantageous to reclaim the etching solution that drains from the one or more process chambers 4 by processing it again through the second circulation loop 2, mixing it with additional etching solution, and passing it again to the first circulation loop 1 for reuse. The dispensed heated etching solution may be drained from the one or more process chambers 4 drain via gravity or a lift pump back into the supply tank 53 of the second circulation loop 2.

A system controller 23 (e.g., a computer) communicates with components of the first circulation loop 1, including the heaters 16 and 17, the temperature probe 20, the pressure probe 22, the pump 39, the DI water supply system 49, the hydration sensor 36, the wafer dispense flow controller 19, and other components of the first circulation loop 1. Although not shown in FIG. 1, the system controller 23 can be configured for communicating with other components of the processing system in FIG. 1, including the second circulation loop 2 and the process chambers 4. The system controller 23 maintains the temperature of the heated etching solution at a desired temperature by measuring the temperature of the heated etching solution using the temperature probe 20 and controlling the heating power of the heaters 16 and 17. Further, the system controller 23 maintains the hydration level of the etching solution at a hydration setpoint by measuring the hydration level and adding DI water as needed using the DI water supply system 49. If the hydration level of the heated etching solution drops below the setpoint, DI water is added to the first circulation loop 1. In this way, the temperature and hydration level of the heated etching solution can be independently controlled such that the heated etching solution does not boil in the first circulation loop, in the nozzle or spray bar, or on the wafer to be processed.

Exemplary pressures for the heated etching solution in the first circulation loop 1 are about 30 psi at the pump, about 25-30 psi above the restricting orifice 21, and about atmospheric pressure between the restricting orifice 21 and the supply tank 12. Exemplary pressures for the heated etching solution in the process chambers 4 can be about 2 psi inside the spray bar 220 in FIG. 3, and about atmospheric pressure in the processing region 240 above the wafer 206 in the process chamber 300 in FIG. 3 and process chamber 200 in FIG. 2. Thus, in those examples the pressure of the heated etching solution may vary in the processing system 100 from about 30 psi to about atmospheric pressure. According to some embodiments, a pressure of the etching solution in the first circulation loop 1 can be about 30 psi, between about 30 psi and about 10 psi, between about 20 psi and about 10 psi, or less than 10 psi.

Figure 2:
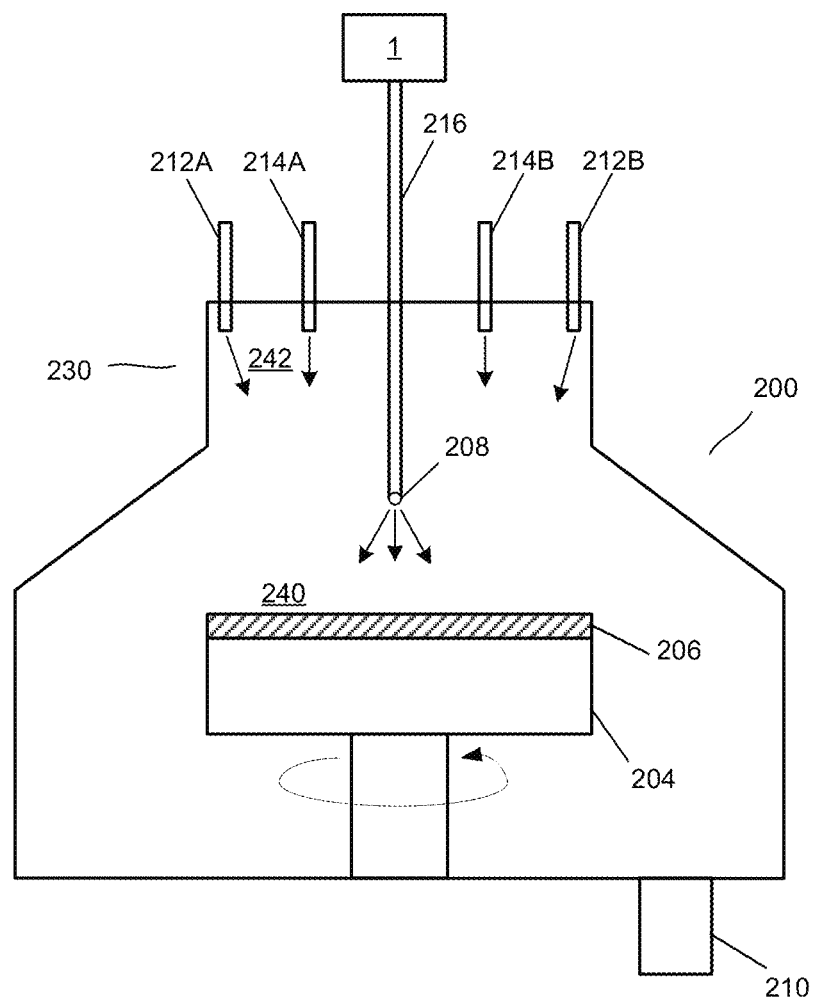
Figure 3:
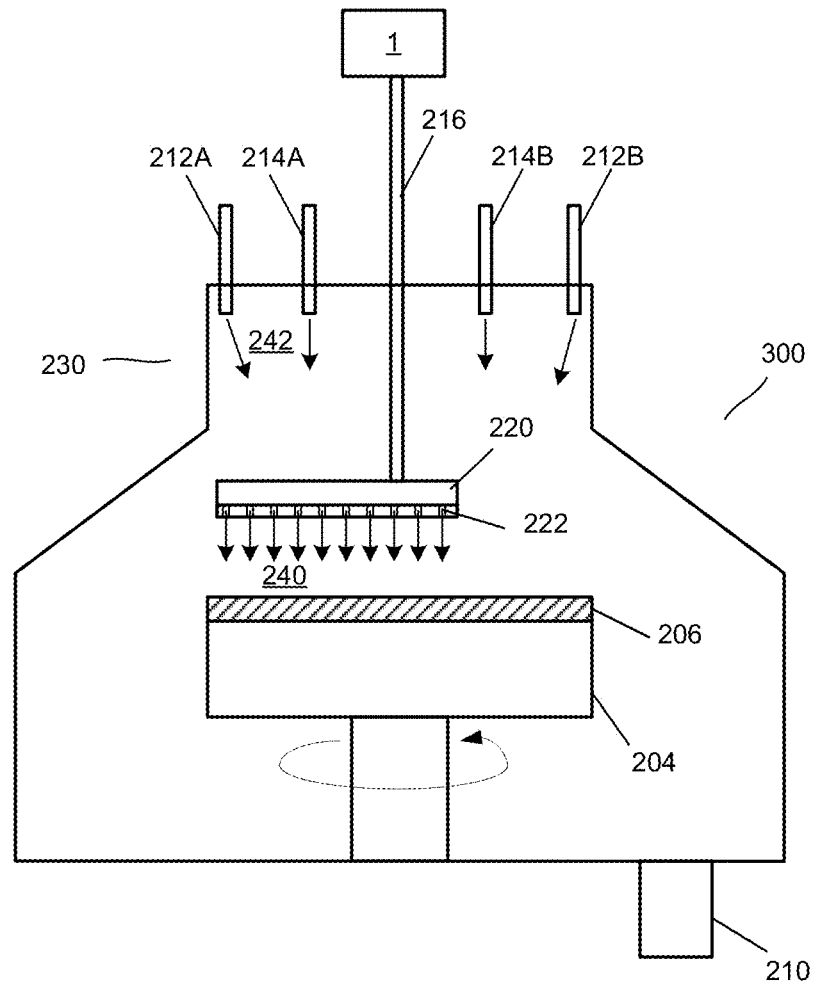

FIG. 2 schematically shows a process chamber 200 for treating substrates or wafers with a heated etching solution according to an embodiment of the invention. The heated etching solution is dispensed from the first circulation loop 1 through a delivery line 216 to a nozzle 208. The heated etching solution is dispensed onto the rotating wafer 206 that is supported by a holder 204 and drained from the process chamber 200 using a drain 210. The process chamber 200 is further configured for separately introducing a gas (e.g., nitrogen ($N_2$)), and steam (water). As depicted in FIG. 2, the heated etching solution may be introduced into a processing region 240 proximate the wafer 206 and the $N_2$ and the steam may be introduced into an exterior region 242 that is removed from the wafer 206. The $N_2$ and steam may be introduced using ports 212A, 212B, 214A, and 214B in the dispense head intake manifold 230. As shown in FIG. 3, the ports 212A, 212B, 214A, and 214B may be positioned over an edge region of the wafer 206. The process chamber 200 may further be configured for adding additional steam to the heated etching solution in the nozzle 208. According to some embodiments, the hydration level of a phosphoric acid etching solution dispensed through the nozzle 208 can be less than about 15%, less than about 14%, less than about 13%, less than about 12%, less than about 11%, or less than about 10%.

FIG. 3 schematically shows a process chamber for treating wafers with a heated etching solution according to an embodiment of the invention. The process chamber in FIG. 3 is similar to the process chamber in FIG. 2 but includes a spray bar 220 for dispensing the heated etching solution through holes 222 and onto the wafer 206. The process chamber 300 may further be configured for adding additional steam in the spray bar 220.

Figure 4:
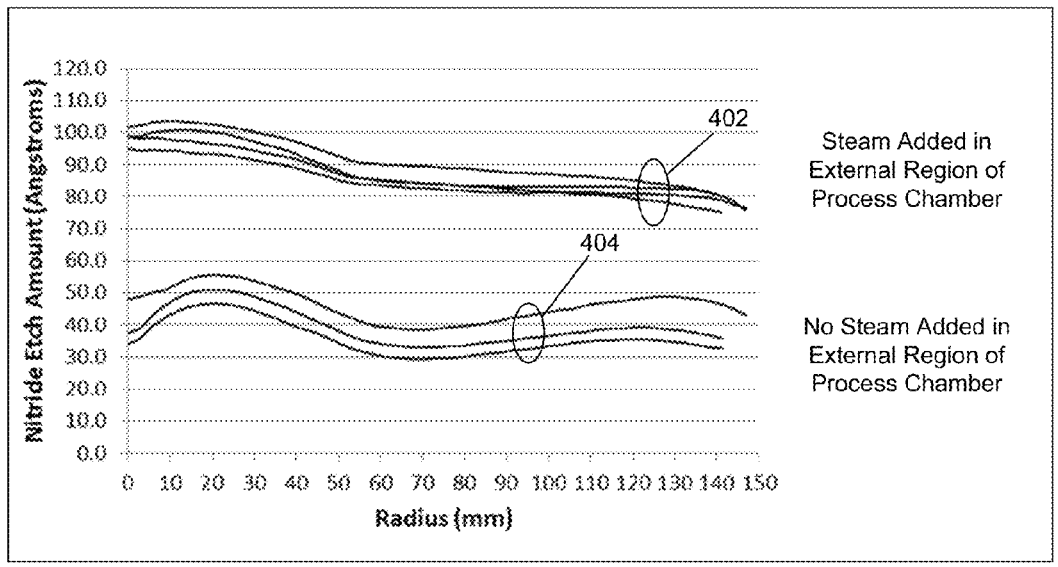
FIG. 4 shows amount of silicon nitride etched according to an embodiment of the invention.

In a first process example, a heated phosphoric acid etching solution and steam were dispensed through the spray bar and onto a 300 mm wafer having a silicon nitride film thereon. The heated phosphoric acid etching solution was prepared using conventional methods as described above where the boiling point and hydration level are locked together by operating at a boiling condition for the etching solution. The heated phosphoric acid etching solution was introduced into the processing region above the wafer as depicted in FIG. 3. Additional steam was added to the spray bar during the introduction of the heated etching solution. FIG. 4 shows amount of silicon nitride etched for a radial line scan from the center to the edge of the wafer. The etching process utilized a 150 second phosphoric acid dispense at 165° C. The upper set of curves 402 show nitride etch amount when steam but no $N_2$ was added to an external region of process chamber using ports in the dispense head intake manifold during the phosphoric acid dispense, and the lower set of curves 404 show nitride etch amount when $N_2$ but no steam was added to an external region of process chamber using the ports in the dispense head intake manifold to the process chamber during the phosphoric acid dispense. The results in FIG. 4 show that the addition of steam to the external region of the process chamber greatly increased the nitride etch amount and improved the etch uniformity across the wafer.

Figure 5:
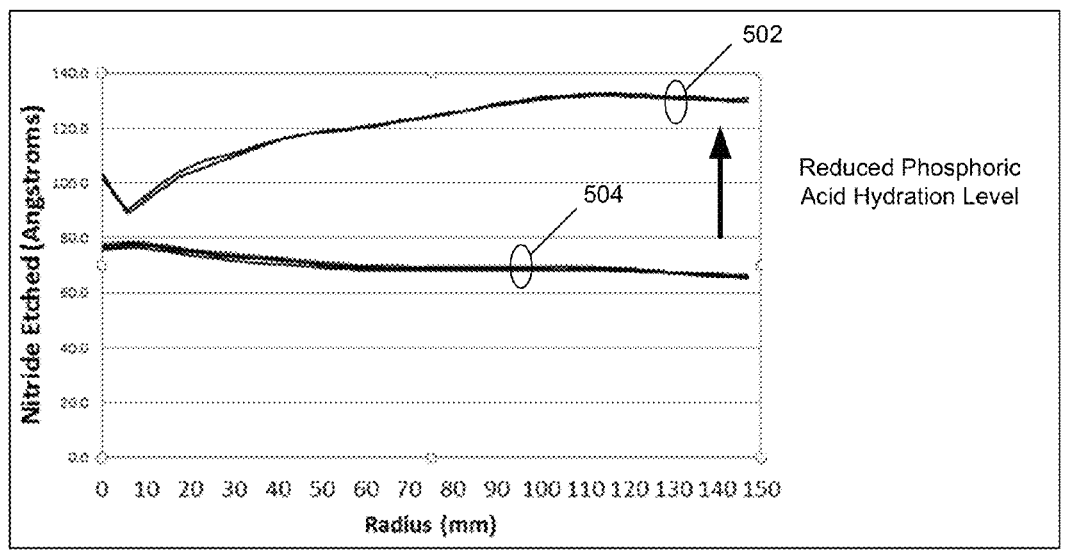
FIG. 5 shows amount of silicon nitride etched according to an embodiment of the invention.

In a second process example, the hydration level of the dispensed phosphoric acid etching solution was lower than in the first process example described above. The phosphoric acid etching solution was prepared with low hydration level by circulating the etching solution for several hours in the first circulation loop without adding any DI water. However, such a phosphoric acid etching solution may also be prepared with low hydration level using the independent control of the hydration level and the temperature described above. FIG. 5 shows amount of silicon nitride etched for a radial line scan from the center to the edge of the 300 mm wafer. The etching process utilized a 60 second phosphoric acid dispense at 180° C. The upper set of curves 502 show nitride etch amount when using the phosphoric acid having a low hydration level. The lower set of curves 504 show nitride etch amount for a heated phosphoric acid etching solution that was prepared using conventional methods as described above where the boiling point and hydration level are locked together by operating at a boiling condition for the etching solution. Steam was added to the spray bar and the ports in the dispense head intake manifold for all the runs. The results in FIG. 5 show that lowering the hydration level of the phosphoric acid greatly increased the nitride etch amount, in particular towards the edge of the wafers.

Figure 6:
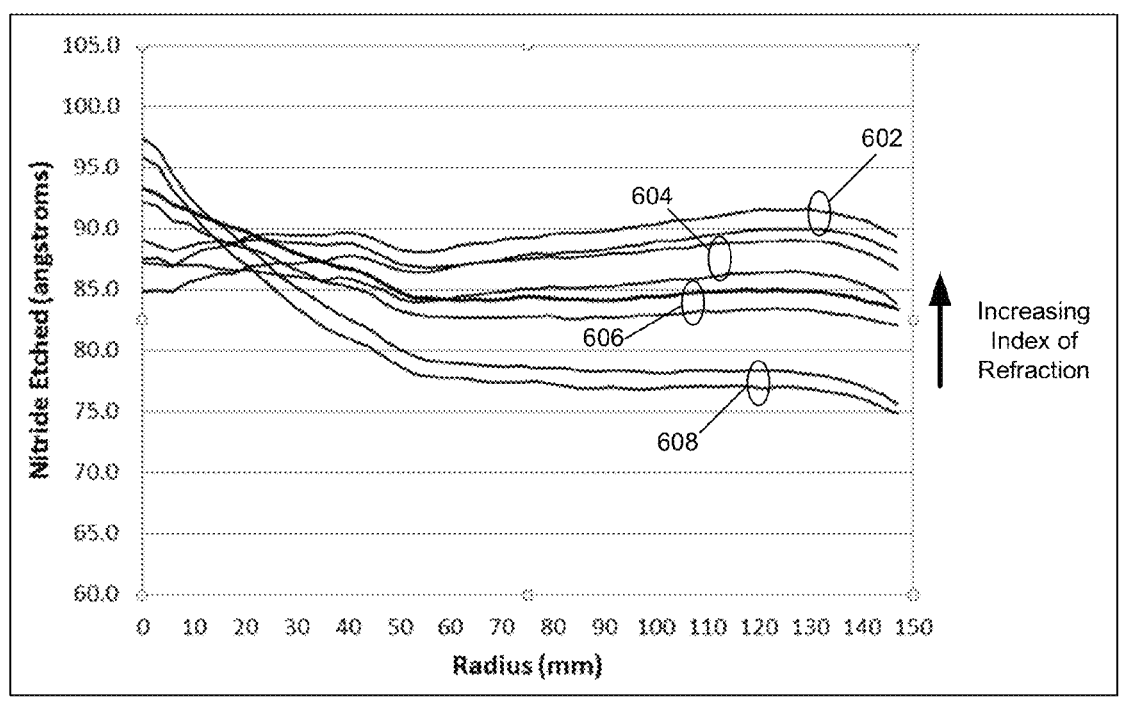
FIG. 6 shows the effect of the hydration level of the phosphoric acid etching solution on silicon nitride etch amount and etch uniformity across a wafer

As described above, a hydration level of a heated phosphoric acid etching solution may be monitored using a refractometer that measures the refractive index of the etching solution. FIG. 6 shows the effect of the hydration level of the phosphoric acid etching solution on the silicon nitride etch amount and etch uniformity across a 300 mm wafer. Steam was added to the spray bar and to the ports in the dispense head intake manifold for all the runs. The refractive index of the different phosphoric acid etching solutions were 1.4414 (curve 608), 1.4426 (curve 606), 1.4434 (curve 604), and 1.4438 (curve 602), where a higher refractive index corresponds to a lower hydration level of the phosphoric acid etching solution. FIG. 6 shows that an increase in the refractive index resulted in a great improvement in the etch uniformity across the wafer. The etch rate for etching solutions with refractive indexes of 1.4414 and 1.4426 (higher hydration levels) was highest in the center of the wafer but dropped off in a radial direction away from the center. In contrast, the etch rate for etching solutions with refractive indexes of 1.4434 and 1.4438 (lower hydration levels) was high and highly uniform across the entire wafers. This shows that hydration level of the phosphoric acid etching solution may be selected to provide a desired etch uniformity across the wafer. For comparison, the phosphoric acid etching solution that was prepared by circulating the etching solution for several hours without adding any DI water is thought to have a lower hydration level than all the etching solutions in FIG. 6.

Table I shows the % uniformity for the nitride etch amount in FIG. 6 as a function of the measured index of refraction. The % uniformity for etching solutions with a refractive index of 1.4414 was about 12%, % uniformity for etching solutions with a refractive index of 1.4426 was about 5%, and % uniformity for etching solutions with a refractive index of 1.4434 and 1.4438 was about 2%. According to one embodiment of the invention, % uniformity of a silicon nitride etch across a 300 mm wafer is better than 3%.

TABLE I

| Index of Refraction | % Uniformity (Range/2× average) |
|---|---|
| 1.4414 | 12.41 |
| 1.4414 | 12.5 |
| 1.4426 | 5.71 |
| 1.4426 | 5.39 |
| 1.4434 | 2.08 |
| 1.4434 | 1.35 |
| 1.4438 | 2.62 |
| 1.4438 | 2.91 |

It is contemplated that the use of a heated phosphoric acid etching solution with a low hydration level results in a temperature boost for the etching solution when mixed with the steam introduced into the exterior region that is removed from the wafer in the process chamber. This temperature boost increases the etching rate of the film on the wafer. Further, etch uniformity is improved due to strong interaction of the steam with the heated phosphoric acid near an edge region of the wafer.

Embodiments for improving temperature and hydration level control of a heated etching solution have been disclosed. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of providing independent temperature and hydration control for a heated etching solution used to treat a wafer in one or more process chambers, the method comprising:
    circulating the heated etching solution in a first circulation path comprising the one or more process chambers and a first circulation loop from which the heated etching solution is dispensed into the process chamber, wherein the heated etching solution comprises aqueous phosphoric acid, wherein pressures of the heated etching solution vary as the heated etching solution circulates in the first circulation path, and wherein the hydration level and a temperature of the heated etching solution are independently known and controlled;
    using a hydration sensor that provides a signal indicative of the hydration level of the heated etching solution;
    independently from controlling the temperature of the heated etching solution, using an output of the hydration sensor to control the hydration level of the heated etching solution at a hydration setpoint by adding water from the heated etching solution, wherein the addition of water is based on the output of the hydration sensor and the desired hydration setpoint;
    measuring the temperature of the heated etching solution;
    independently from controlling the hydration level, using the measured temperature to control the heated etching solution at a desired temperature setpoint; and
    dispensing the heated etching solution into the process chamber to treat the wafer, wherein the heated etching solution is at a temperature below its boiling point when dispensed from a nozzle or a spray bar above the wafer to eliminate boiling of the heated etching solution in the first circulation loop, on the wafer, and in the nozzle or the spray bar.

2. The method of claim 1, further comprising co-dispensing steam into the process chamber to treat the wafer with the heated etching solution in the presence of the steam, wherein the dispensing of the heated etching solution and the steam comprises
    dispensing the heated etching solution into a processing region proximate the wafer in the process chamber;
    introducing steam into an exterior region in the process chamber that is removed from the wafer in the process chamber; and
    treating the wafer with the heated etching solution and the steam.

3. The method of claim 1, further comprising the step of controlling the heated etching solution at a hydration level that is selected to provide a desired etch uniformity.

4. The method of claim 1, wherein a pressure of the heated etching solution in the first circulation loop is between 30 psi and 10 psi, and wherein a pressure of the heated etching solution in the process chamber is atmospheric pressure.

5. The method of claim 1, further comprising
    circulating additional heated etching solution in a second circulation loop that is in fluid communication with the first circulation loop; and
    introducing the additional heated etching solution from the second circulation loop into the first circulation loop.

6. The method of claim 5, wherein the additional heated etching solution has a lower water content than the heated etching solution in the first circulation loop.

7. The method of claim 5, wherein the additional heated etching solution is maintained at a higher temperature than the heated etching solution in the first circulation loop.

8. The method of claim 1, wherein the maintaining the heated etching solution at the hydration setpoint and the temperature setpoint is controlled in separate control loops by a system controller.

9. A processing system, comprising:
(a) a heated etching solution comprising aqueous phosphoric acid, wherein the heated etching solution has a temperature and a hydration level that are independently known and controlled;
(b) a process chamber in which the heated etching solution is dispensed onto a wafer from a nozzle or a spray bar above the wafer;
(c) a first circulation loop that provides the heated etching solution to the process chamber, wherein the first circulation loop includes
a heater that heats the heated etching solution,
a pump that pressurizes and circulates the heated etching solution,
a temperature probe that measures the temperature of the heated etching solution;
a hydration sensor that provides a signal indicative of the hydration level of the heated etching solution,
(d) a water supply for adding water to the heated etching solution;
(e) a first control loop that uses an output of the hydration sensor to add water to the heated etching solution to control the hydration level at a desired hydration; and
(f) a second control loop that uses the measured temperature to control the temperature of the heated etching solution at a desired setpoint;
wherein pressures of the heated etching solution vary as the heated etching solution circulates in the first circulation loop; and
wherein the heated etching solution is at a temperature below its boiling point when dispensed from the nozzle or the spray bar above the wafer to eliminate boiling of the heated etching solution in the first circulation loop, on the wafer, and in the nozzle or the spray bar.

10. The processing system of claim 9, wherein the process chamber further includes
means for dispensing the heated etching solution into a processing region proximate the wafer in the process chamber; and
means for introducing steam into an exterior region in the process chamber that is removed from the wafer in the process chamber.

11. The processing system of claim 9, further comprising a second circulation loop for providing additional etching solution to the first circulation loop.

12. The processing system of claim 11, wherein the second circulation loop includes
a heater to heat the additional etching solution,
a pump to pressurize and circulate the additional etching solution,
a temperature probe that measures the temperature of the additional etching solution,
a fresh etching solution supply, and
a water supply to add water to the additional etching solution.

13. The processing system of claim 12, the second circulation loop further comprising a hydration sensor that provides a signal indicative of a hydration level of the additional etching solution.

* * * * *